United States Patent [19]
Ricci, Jr. et al.

[11] Patent Number: 5,226,825
[45] Date of Patent: Jul. 13, 1993

[54] SURFACE MOUNT CHIP CARRIER SOCKET

[75] Inventors: Ronald R. Ricci, Jr., Kernersville, N.C.; Kevin E. Walker, Harrisburg, Pa.

[73] Assignee: The Whitaker Corporation, Wilmington, Del.

[21] Appl. No.: 994,188

[22] Filed: Dec. 21, 1992

Related U.S. Application Data

[63] Continuation of Ser. No. 821,506, Jan. 15, 1992, abandoned.

[51] Int. Cl.[5] .......................................... H01R 23/72
[52] U.S. Cl. .................................... 439/70; 439/526; 439/680; 439/876
[58] Field of Search .................................. 439/68–73, 439/525, 526, 83, 876, 680, 681

[56] References Cited
U.S. PATENT DOCUMENTS

| | | | |
|---|---|---|---|
| Re. 33,268 | 7/1990 | Grabbe et al. | 439/525 |
| 4,089,575 | 5/1978 | Grabbe | 439/71 |
| 4,872,845 | 10/1989 | Korsunsky et al. | 439/70 |
| 4,936,784 | 6/1990 | Saito | 439/331 |

FOREIGN PATENT DOCUMENTS 87126 8/1983 European Pat. Off. .............. 439/83

*Primary Examiner*—Neil Abrams
*Attorney, Agent, or Firm*—Gerald K. Kita; Robert J. Kapalka

[57] ABSTRACT

A chip carrier socket 2 comprises, a chip carrier receiving member, multiple electrical terminals 4 extending over component mounting pads 64 of a substrate 10, and surface mount contacts 62 of the terminals 4 being aligned so as to engage the conductive mounting pads 64 that are in alignment with conductive leads 6 of a chip carrier 8, whereby the same mounting pads 64 can be used for surface mount attachment to the leads 6, and can be used for surface mount attachment to the terminals 4 of the chip carrier socket 2. The terminals include recesses 66 on edges adjacent to the surface mount contacts to prevent these edges from being wetted by solder. Certain ones of the terminals include posts 38 to uniquely orient the socket 2 with respect to the substrate 10.

3 Claims, 5 Drawing Sheets

SURFACE MOUNT CHIP CARRIER SOCKET

This application is a Continuation of application Ser. No. 07/821,506 filed Jan. 15, 1992, now abandoned.

The present invention relates to a chip carrier socket, and more particularly to a socket for a chip carrier known as a plastic quad flat pack (PQFP) adapted for surface mount assembly on a substrate.

BACKGROUND OF THE INVENTION

A known chip carrier socket, disclosed in U.S. Pat. No. 4,872,845, is adapted with electrical terminals for mounting the socket to a substrate or circuit board. The terminals have resilient arms that electrically engage leads of the chip carrier. The terminals have mounting portions in the form of elongated posts that are inserted along apertures extending into the substrate or circuit board. These apertures are referred to as component mounting apertures, for the reason that they are utilized for mounting components such as a chip carrier socket.

Although this known chip carrier socket is adapted for use with a substrate having component mounting apertures, the current trend of industry practice is to eliminate component mounting apertures in substrates (circuit boards). Eliminating the apertures simplifies the manufacture of the substrate, and provides more surface area of the substrate available for circuits. In addition, the industry desires to eliminate chip carrier sockets, by direct attachment of chip carriers to the substrates. Instead of component mounting apertures, the substrate is provided with component mounting pads, a series of conductive surface areas on the surface of the substrate to engage respective electrical leads of the chip carrier. The chip carriers are mounted to the substrate by surface mount, referring to direct attachment of the component mounting pads and the electrical leads of an electrical component, such as a chip carrier, by solder joints. If the leads of the chip carriers are attached by surface mount, the chip carriers are not readily removed for repair or replacement. Accordingly, when one or more of the chip carriers are known to require repair or replacement more frequently than others, it is necessary that those be mounted in chip carrier sockets that releasably mount the chip carriers needing repair or replacement. Such chip carrier sockets need to be adapted for surface mount. Further, such chip carrier sockets need to be adapted in alignment with the leads of the chip carrier for attachment to the pattern of component mounting pads in alignment with the leads of the chip carrier.

SUMMARY OF THE INVENTION

The invention fulfills a need for a chip carrier socket adapted for mounting to a substrate without using terminal posts extending through apertures of such a substrate. In addition, the invention fulfills a need for adapting terminals of a chip carrier socket for surface mount attachment to component mounting pads arranged in alignment with the component leads of a chip carrier. According to the invention, a chip carrier socket adapted for surface mount attachment to a substrate comprises; a chip carrier receiving member having a chip carrier opening for receiving a chip carrier, multiple electrical terminals adjacent the opening having resilient means with contact surfaces for resiliently engaging electrical leads of a chip carrier received in the opening, the terminals extending over component mounting pads of a substrate, and surface mount contacts of the terminals being aligned with respective contact surfaces so as to engage conductive mounting pads of a substrate that are in alignment with respective contact surfaces when engaged with electrical leads of a chip carrier, whereby the same mounting pads of the substrate for surface mount attachment to the leads of the chip carrier can be used for surface mount attachment to the terminals of the chip carrier socket.

The invention will now be described by way of example with reference to the drawings, according to which:

DETAILED DESCRIPTION

Figure 1:
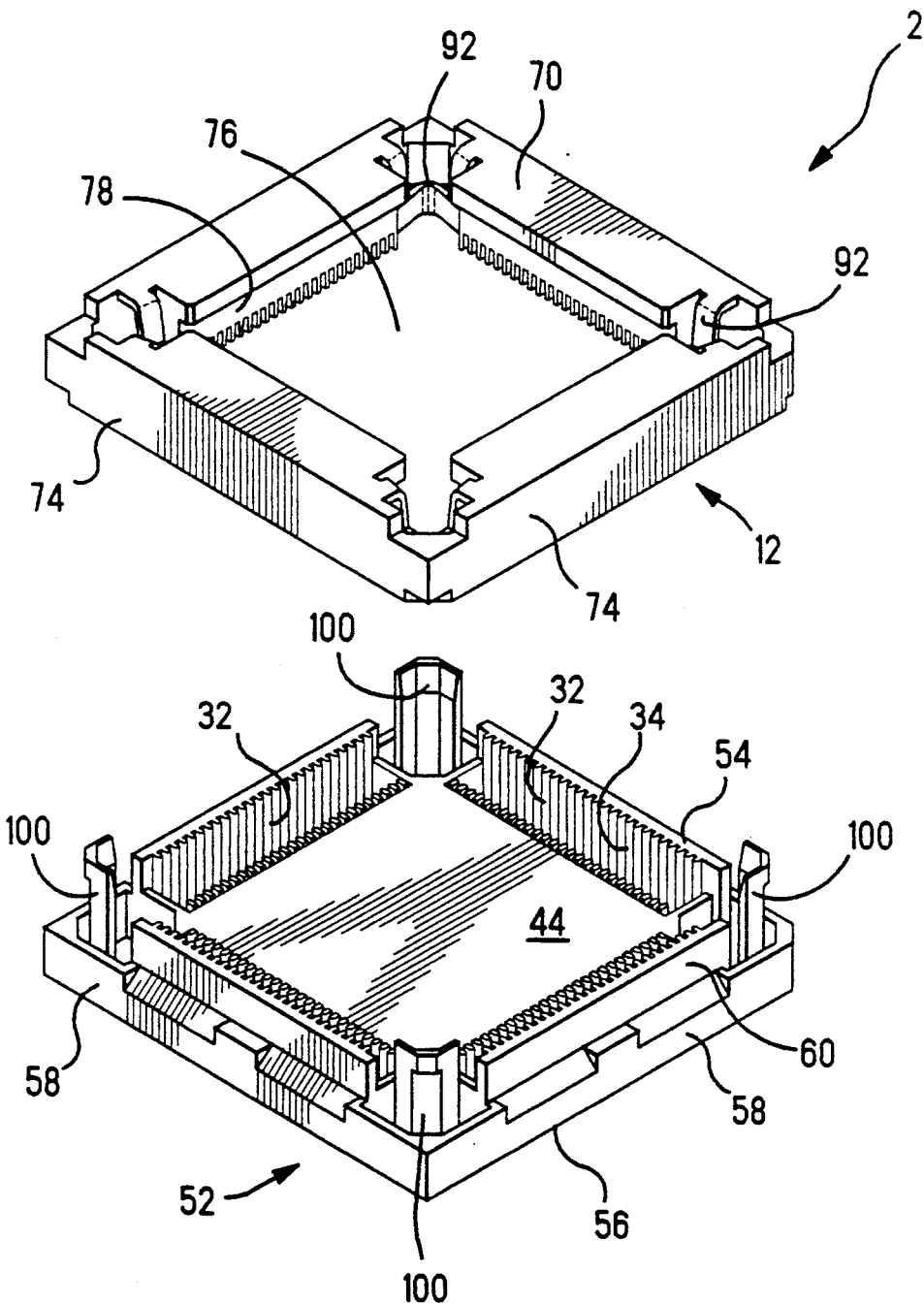
FIG. 1 is an exploded perspective view of a chip carrier socket including a cover.
Figure 2:
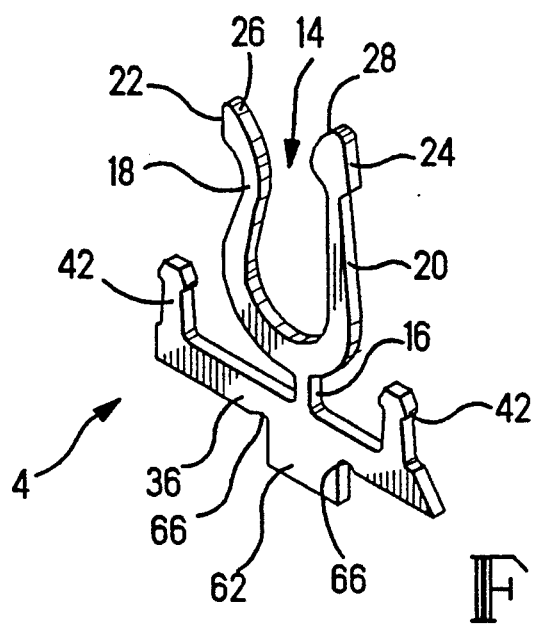
FIG. 2 is an enlarged perspective view of a terminal which is provided in the chip carrier socket of FIG. 1.
Figure 3:
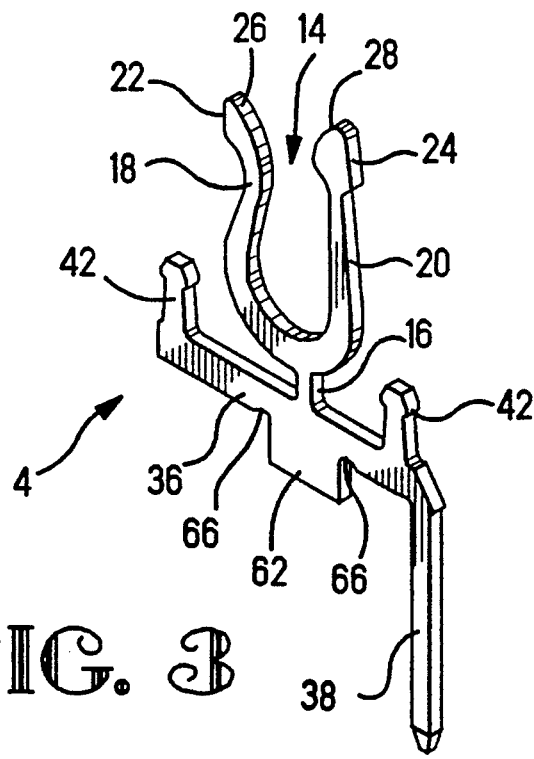
FIG. 3 is a view similar to FIG. 2 of a terminal with a post.
Figure 4:
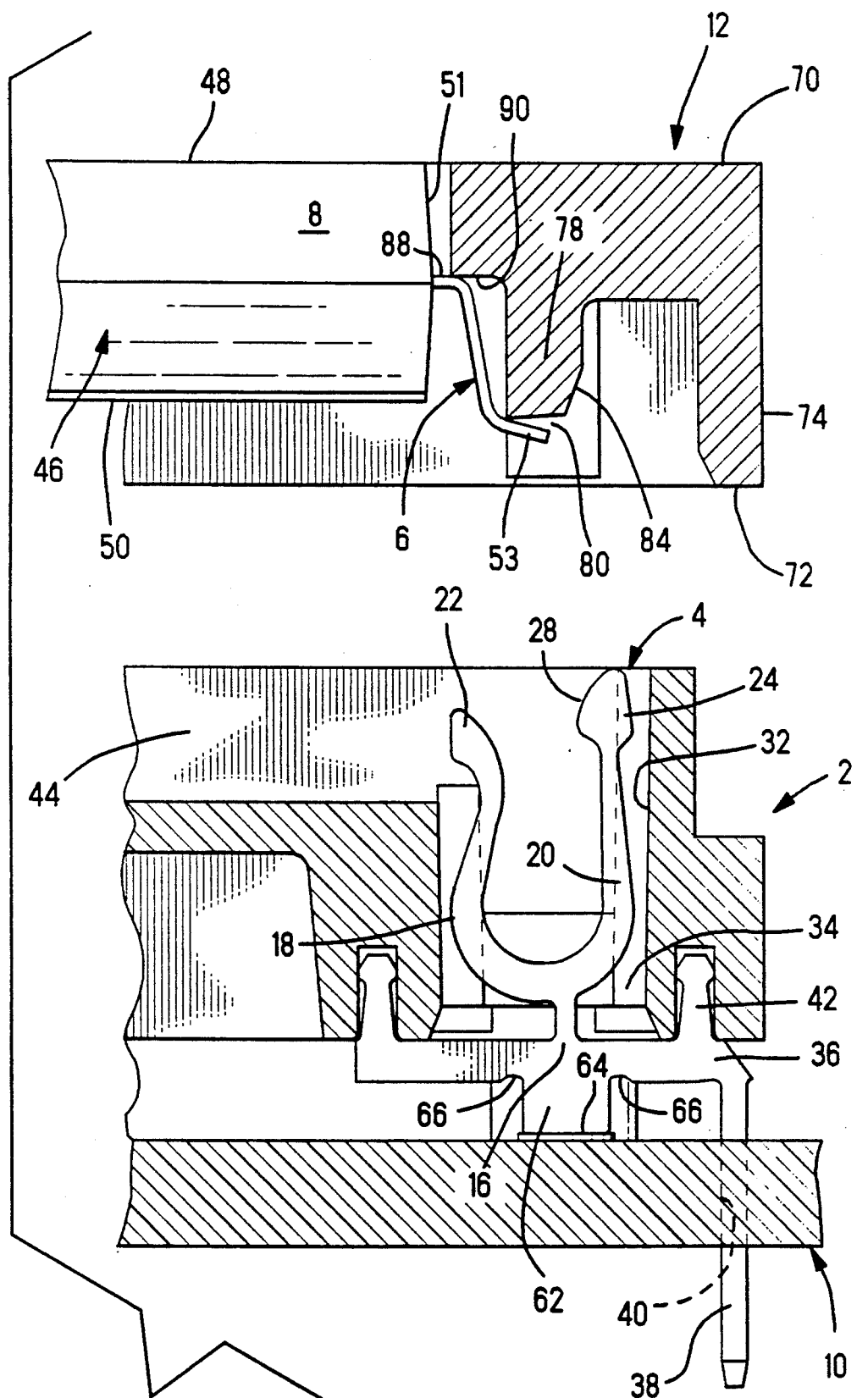
FIG. 4 is a view in section of a portion of the chip carrier socket showing the terminals of the socket prior to insertion of the cover.

With reference to FIGS. 1–4, the figures show a chip carrier socket 2 containing multiple conductive electrical terminals 4, which engage contact leads 6 of a chip carrier 8 and each of which are to be connected to conductors on a substrate 10. The socket 2 includes a cover 12. Each of the terminals 4 is formed from a metal strip with shaped edges in the thickness of the metal strip. Each terminal 4 (FIG. 2) is of unitary construction and comprises a resilient portion 14 having a flexible leg 16 extending from the resilient portion 14. The configuration of the resilient portion 14 includes two resilient arms 18, 20 have free ends 22, 24 spaded from each other. The first resilient arm 18 is a contact arm, and has a contact surface 26 which cooperates with a respective lead 6 of the chip carrier 8. The second resilient arm 20 has a lead in surface 28, FIG. 4, to guide the cover 12 into place. Neither arm 18, 20 of the terminals 4 is engagement with side surfaces 32 of terminal receiving cavities 34 of socket 2 when the terminal 4 is in an unstressed first position as shown in FIG. 4.

Dimensional variation or misalignment of the chip carrier 8 during its insertion into the socket 2, may cause the positions of the component leads 6 to vary in relation to how they are presented to the resilient portions 14. It is important to allow each U-shaped resilient portion 14 to pivot by being pivotally mounted on the leg 16, to reposition itself and thereby adjust to various positions for engagement with the leads 6.

Figure 5:
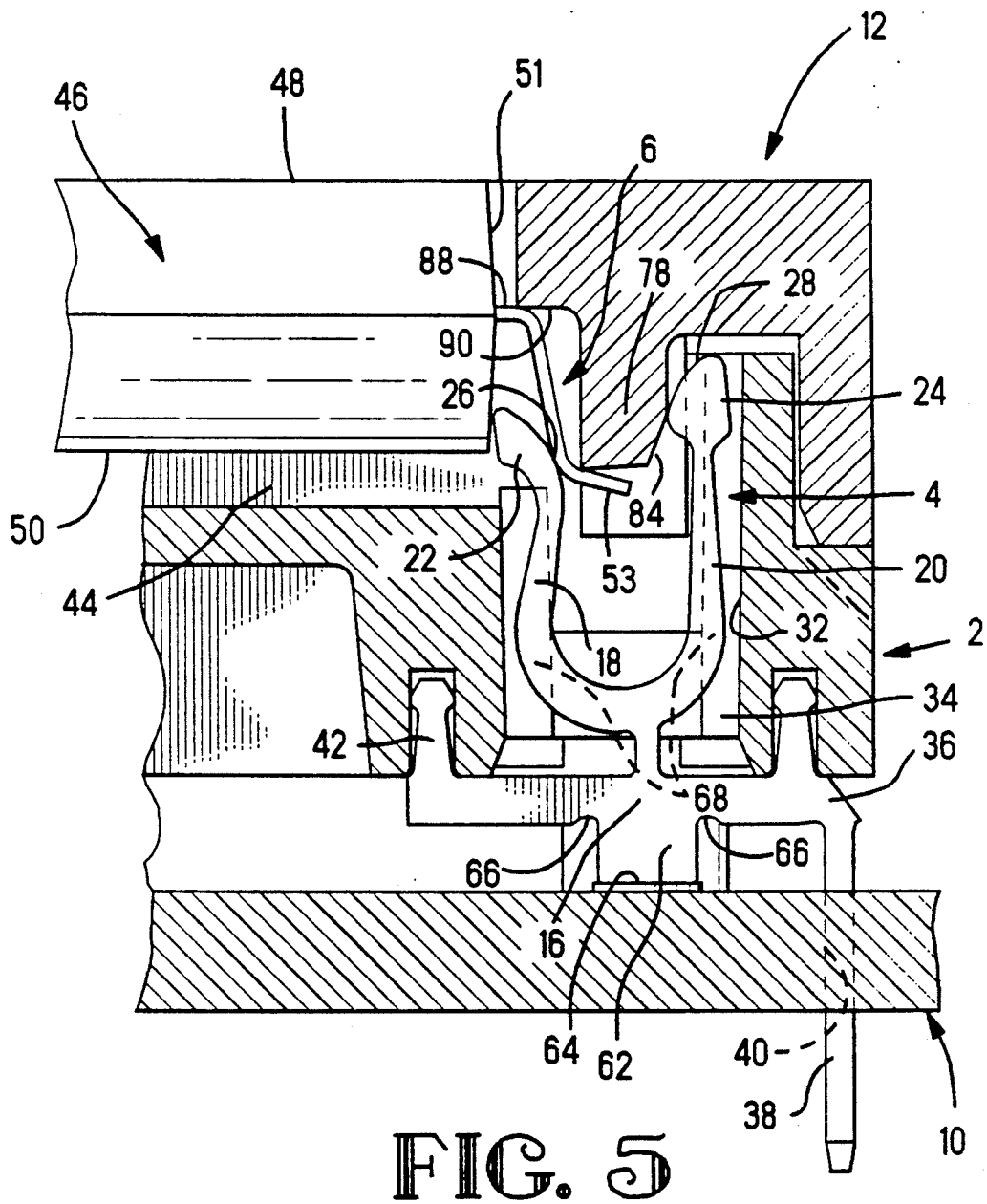
FIG. 5 is a view similar to FIG. 3, showing the chip carrier socket with the cover and a chip carrier.

Each bar 36 has two support portions 42 which extend upward, in the same direction as leg 16, and which cooperate with the housing of socket 2. In FIG. 5, the chip carrier is inserted in a chip carrier receiving opening or recess 44, with the leads 6 and a portion of cover 12 are inserted to extend between free ends 22, 24 of the resilient arms 18, 20, as shown in FIG. 4, and impose forces on the free ends 22, 24, the leads making electrical connections with the terminals 4.

The chip carrier 8, FIG. 4, comprises, a body 46 having upper and lower major surfaces 48, 50 and side surfaces 51 from which extend the leads 6. End portions 53 of the leads 6 are bent to approach parallel to the surface 50.

The socket 2 comprises a socket body 52 having major surfaces 54, 56 and side surfaces 58, each of which has an offset portion 60 proximate the major surface 54 to cooperate with the cover 12. The recess 44 has recess side surfaces corresponding to side walls 32 of cavities 34 that extend to the surface 56.

The terminal receiving cavities 34 extend from the surface 54 proximate a corner of the recess 44 to proximate an adjacent corner of the recess 44 at the surface 56. Side by side slots 68 are provided on side surfaces 32, and cooperate with respective terminals 4 to align them in position. The terminals 4 are positioned in the slots 68 to prevent them from engaging one another. The side walls 32 do not extend to the first major surface 54 to allow for insertion of the chip carrier 8 into the recess 44.

Cover 12 comprises, a first major surface 70, a second major surface 72, and side surfaces 74 extending therebetween. A chip carrier receiving recess 76 extends from the surface 70 to the surface 72. Chip carrier protective arms 78 extend in the recesses 76 which cooperate with the leads 6. Each lead 6 is positioned in a slot 80 of arm 78, to prevent the leads 6 from electrically engaging one another, and also to protect the leads 6 from being damaged during insertion of the chip carrier 8 into the socket 8. Arms 78 have lead in surfaces 84 and cooperate with arms 20. The chip carrier 8 is inserted into the cover 12 through the surface 72 until leading surfaces 88 of the leads 6 face toward surfaces 90 of slots 80. The chip carrier 8 is maintained in the cover 12 by securing arms 92 engaging the chip carrier socket 2. Chip carrier socket 2 has latching arms 100 provided proximate the corners of socket body 52 to cooperate with the cover 12 to maintain the cover 12 in position. Further details of the structure described is incorporated herein and appears in U.S. Pat. No. 4,872,845.

The leg 16 of each terminal 4 is integral with a horizontal bar 36 from which mounting portions 38 project downward toward the substrate 10. In FIG. 3, the mounting portion 38 is a projecting post to be recessed in, and in registration with, holes 40 of the substrate 10 to orient the socket 2 on the substrate 10.

Figure 6:
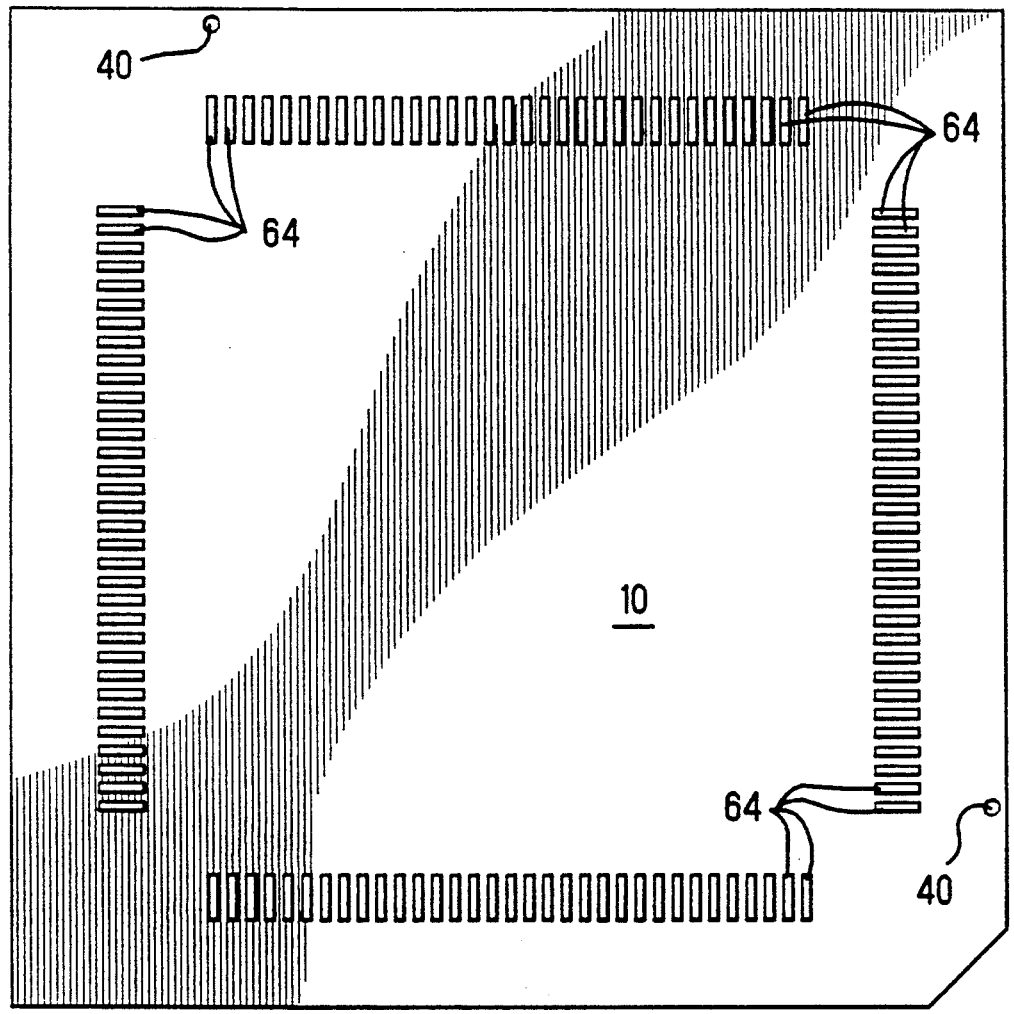
FIG. 6 is a plan view of a substrate having conductive surface mount pads arranged in a pattern.

The chip carrier socket 2 is adapted for surface mount attachment to the substrate 10. The multiple terminals 4 are adjacent the opening 44. The bars 36 of the terminals 4 extend over component mounting pads of the substrate 10 and have integral surface mount contacts 62 aligned vertically with respect to contact surfaces 26 when these engage the electrical leads 6 of the chip carrier 8, so as to engage conductive mounting pads 64, FIGS. 4, 5 and 6, on a top surface of the substrate 10. The bars 36 of the terminals 4 also extend under the spaces receiving the electrical leads 6 of the chip carrier 8. The pads 64 also are in vertical alignment with respective contact surfaces 26, whereby the same mounting pads 64 of the substrate 10 can be used for surface mount attachment to the leads 6 of the chip carrier 8, and can be used for surface mount attachment to the terminals 4 of the chip carrier socket 2. Thereby, the surface mount contacts are located along the terminals so as to be in alignment with respective contact surfaces of said resilient means, and so as to engage the component mounting pads aligned with leads of a chip carrier engaged with the terminals instead of with the component mounting pads.

The surface mount contacts 62 include a thin surface layer of solder, as does the pads 64. The solder is heated to a molten state and then solidified to provide solder joints connecting the surface mount contacts 62 to respective pads 64, according to a known process of reflow soldering. In this manner, the surface mount contacts 62 are joined to the pads 64 by surface mount attachment. The contact surfaces are no greater in area than the area of the component mounting pads to which the contact surfaces are adapted to be joined, and preferably are slightly less in area than the area of the contact pads 64. The surface mount contacts 62 have surface areas generally rectangular in shape and of slightly less surface area than the areas of the component mounting pads 64 to which the surface areas are to be joined by solder.

The surface mount contacts 62 project outwardly from the remainder of the terminals 4 toward the substrate 10 on which the chip carrier socket 2 is to be mounted, and the terminals 4 are recessed adjacent both sides of the surface mount contacts 62 where they join the remainder of the terminals 4, whereby the terminals 4 include means for preventing solder wicking from the surface mount contacts 62 to the remainder of the terminals 4.

Each of the surface mount contacts 62 has a thickness corresponding to the thickness of a metal strip from which the terminals 4 are cut out, and have a length corresponding to slightly less than the length of a corresponding conductive mounting pad 64 of generally, rectangular configuration to which the surface mount contact 62 is to be joined by surface mount attachment. Thereby, the edges of the terminals 4 adjacent to the surface mount contacts 62 are recessed to avoid being wetted by solder used to attach the surface mount contacts 62 and the component mounting pads 64. Further thereby, the terminals 4 include recesses 66 adjacent to where the surface mount contacts 62 join remainders of the terminals 4, and the surface mount contacts 62 project from the edges of the terminals 4 toward the component mounting pads 64.

Other modifications and embodiments of the invention are intended to be covered by the spirit and scope of the appended claims.

We claim:

1. A chip carrier socket adapted for surface mount attachment to component mounting pads of a substrate, comprising:

a chip carrier receiving member having a chip carrier opening for receiving a chip carrier, the receiving member holding multiple electrical terminals adjacent to the opening, the terminals having resiliently biased contact surfaces for resiliently engaging electrical leads of a chip carrier received in the opening, the terminals having surface mount contacts which are alignable with respective ones of the component mounting pads of the substrate, and the terminals having recesses on edges of the terminals adjacent to where the surface mount contacts join remainders of the terminals, the recesses being on opposite sides of the surface mount contacts and opening towards the mounting pads, wherein the recesses prevent the edges from being wetted by solder used to join the surface mount contacts to the component mounting pads.

2. The chip carrier socket according to claim 1, wherein a selected number of the terminals have posts alignable with respective holes of the substrate to orient the chip carrier socket with respect to the substrate.

3. The chip carrier socket according to claim 1, wherein at least one but no more than two of the terminals have posts alignable with respective holes of the substrate to uniquely orient the chip carrier socket with respect to the substrate such that all of the surface mount contacts are aligned with their respective ones of the component mounting pads.

* * * * *